United States Patent
Nishikawa et al.

(10) Patent No.: US 10,276,829 B2
(45) Date of Patent: Apr. 30, 2019

(54) ORGANIC EL DISPLAY DEVICE HAVING MULTILAYERED SEALING FILM AND METHOD FOR MANUFACTURING SAME

(71) Applicant: Sharp Kabushiki Kaisha, Sakai, Osaka (JP)

(72) Inventors: Daichi Nishikawa, Sakai (JP); Takeshi Hirase, Sakai (JP); Tetsuya Okamoto, Sakai (JP); Tohru Senoo, Sakai (JP); Tohru Sonoda, Sakai (JP); Mamoru Ishida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/558,615

(22) PCT Filed: Mar. 11, 2016

(86) PCT No.: PCT/JP2016/001402
§ 371 (c)(1),
(2) Date: Sep. 15, 2017

(87) PCT Pub. No.: WO2016/147639
PCT Pub. Date: Sep. 22, 2016

(65) Prior Publication Data
US 2018/0083225 A1    Mar. 22, 2018

(30) Foreign Application Priority Data
Mar. 17, 2015 (JP) ................................. 2015-053869

(51) Int. Cl.
*H01L 27/32* (2006.01)
*H01L 51/52* (2006.01)
*H01L 51/56* (2006.01)

(52) U.S. Cl.
CPC ...... *H01L 51/5256* (2013.01); *H01L 27/3211* (2013.01); *H01L 51/56* (2013.01);
(Continued)

(58) Field of Classification Search
None
See application file for complete search history.

(56) References Cited

U.S. PATENT DOCUMENTS

| 2009/0072230 | A1* | 3/2009 | Ito ........................ C23C 16/30 257/40 |
| 2010/0019654 | A1  | 1/2010 | Hayashi |
| 2016/0072099 | A1* | 3/2016 | Okamoto ............ H01L 51/5253 257/40 |

FOREIGN PATENT DOCUMENTS

| JP | 2007-273274 A | 10/2007 |
| JP | 2009-090634 A | 4/2009 |

(Continued)

OTHER PUBLICATIONS

Machine language translation of JP 2009-090634 A.*
Official Communication issued in International Patent Application No. PCT/JP2016/001402, dated May 31, 2016.

*Primary Examiner* — Erik Kielin
(74) *Attorney, Agent, or Firm* — Keating & Bennett, LLP (57) ABSTRACT

An organic EL display device 1 includes: an organic EL element 4 provided above an element substrate 10; and a sealing film 2 formed above the element substrate 10 so as to cover the organic EL element 4, and made of silicon nitride (SiNx). The sealing film 2 is comprised of a first sealing layer 25, a second sealing layer 26 provided on the surface of the first sealing layer 25, and a third sealing layer 27 provided on the surface of the second sealing layer 26. This organic EL display device 1 is characterized in that a ratio of an SiN-group content to an NH-group content is higher in the first and third sealing layers 25 and 27 than in (Continued)

the second sealing layer 26 based on the absorption area ratio determined by FT-IR measurement.

9 Claims, 6 Drawing Sheets

(52) U.S. Cl.
CPC ...... *H01L 27/3244* (2013.01); *H01L 51/5253* (2013.01); *H01L 2227/323* (2013.01)

(56) References Cited

FOREIGN PATENT DOCUMENTS

| | | | |
|---|---|---|---|
| JP | 2010-027561 A | 2/2010 | |
| JP | 2012-209209 A | 10/2012 | |
| WO | WO-2014174892 A1 * | 10/2014 | ......... H01L 51/5253 |

* cited by examiner

ORGANIC EL DISPLAY DEVICE HAVING MULTILAYERED SEALING FILM AND METHOD FOR MANUFACTURING SAME

TECHNICAL FIELD

The present invention relates to an organic EL display device including an organic electroluminescence element (hereinafter referred to as an "organic EL element"), and a method of manufacturing such a display.

BACKGROUND ART

In recent years, liquid crystal display devices are often used as flat panel displays in various fields. However, contrast and shade vary depending on viewing angles. A need for a light source such as a backlight hinders lower power consumption. Reduction in the thickness and weight of a liquid crystal display is limited. These serious problems still remain.

To address the problems, self-luminous organic EL display devices including organic EL elements are expected in place of liquid crystal displays. In an organic EL element, a current flows through organic EL layers sandwiched between an anode and a cathode so that organic molecules forming the organic EL layers emit light. Being self-luminous, organic EL display devices using such an organic EL element are thin, light, and low in power consumption. In addition, organic EL display devices provide a wide viewing angle, and thus draw great attention as a flat panel display in the next generation.

However, in general, after a certain period of drive, light-emitting characteristics, such as brightness and uniformity in light emission, of an organic EL element deteriorate significantly from the initial state. The deterioration in the light-emitting characteristics is attributed to deterioration of an organic layer due to moisture of outside air and oxygen, which has entered the organic EL element, or separation of the organic layer from an electrode due to moisture.

To address the problems, a technique of providing a sealing film to reduce entry of gas generated by, e.g., moisture is disclosed. More specifically, an organic EL display device has been disclosed which includes a plurality of light-emitting elements arranged above a substrate, an organic buffer layer covering the plurality of light-emitting elements; and a gas barrier layer covering the organic buffer layer, wherein the gas barrier layer has first inorganic films containing a silicon compound containing nitrogen and second inorganic films containing an oxide of a material for forming the first inorganic films. Such a configuration may provide an organic EL display device having a gas barrier layer with durability under stress (see, for example, Patent Document 1).

CITATION LIST

Patent Document

Patent Document 1: Japanese Unexamined Patent Publication No. 2010-27561

SUMMARY OF THE INVENTION

Technical Problem

However, in the gas barrier layer disclosed in Patent Document 1, the second inorganic films of the gas barrier layer have an oxide. Thus, oxygen (material gas) used in forming the second inorganic films causes damage to the organic EL element, which is a problem.

Also, the gas barrier layer disclosed in Patent Document 1 is formed by high density plasma deposition of films, such as a plasma chemical vapor deposition (CVD) method. At this time, it is difficult to avoid generation of a pin hole in the gas barrier layer, and thus, this gas barrier layer has difficulty in blocking entry of moisture and oxygen due to this pin hole, which is also a problem.

In view of the foregoing problems, it is therefore an object of the present invention to provide an organic EL display device capable of improving the barrier properties of a sealing film and reducing deterioration of the organic EL element, and to provide a method of manufacturing such an organic EL display device.

Solution to the Problem

In order to achieve the object, an organic EL display device according to the present invention includes: an element substrate; an organic EL element provided above the element substrate; and a sealing film provided above the element substrate so as to cover the organic EL element, the sealing film being made of silicon nitride ($SiN_x$). The sealing film is comprised of a first sealing layer provided on a surface of the organic EL element, a second sealing layer provided on a surface of the first sealing layer, and a third sealing layer provided on a surface of the second sealing layer. A ratio of an SiN-group content to an NH-group content is higher in the first and third sealing layers than in the second sealing layer based on an absorption area ratio determined by FT-IR measurement.

A method of manufacturing an organic EL display device including an element substrate, an organic EL element provided above the element substrate, and a sealing film provided above the element substrate so as to cover the organic EL element, the sealing film being made of silicon nitride (SiNx), and the sealing film being comprised of a first sealing layer provided on a surface of the organic EL element, a second sealing layer provided on a surface of the first sealing layer, and a third sealing layer provided on a surface of the second sealing layer includes forming the sealing film such that a ratio of an SiN-group content to an NH-group content is higher in the first and third sealing layers than in the second sealing layer based on an absorption area ratio determined by FT-IR measurement.

Advantages of the Invention

According to the present invention, a sealing film may have improved barrier properties against moisture and oxygen to reduce the deterioration of an organic EL element.

DESCRIPTION OF EMBODIMENTS

Embodiments of the present invention will now be described in detail with reference to the drawings. The present invention is not limited to the following embodiments.

First Embodiment

Figure 1:
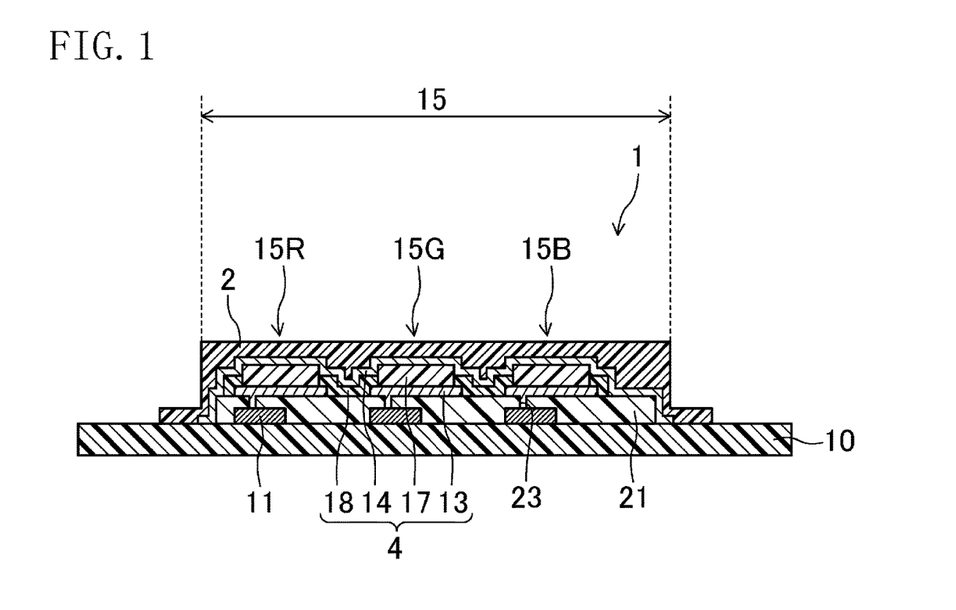
FIG. 1 is a cross-sectional view of an organic EL display device according to a first embodiment of the present invention.
Figure 2:
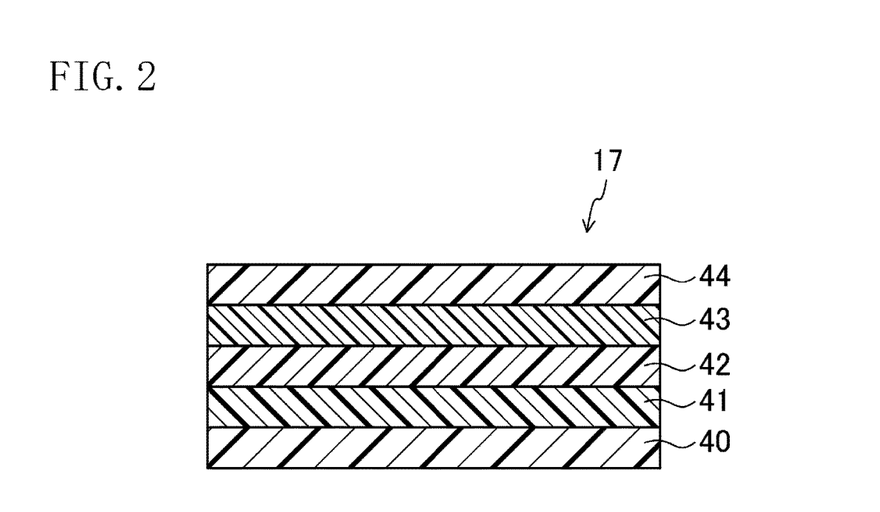
FIG. 2 is a cross-sectional view illustrating an organic EL layer forming an organic EL element included in the organic EL display device according to the first embodiment of the present invention.

FIG. 1 is a cross-sectional view of an organic EL display device according to a first embodiment of the present invention. FIG. 2 is a cross-sectional view illustrating an organic EL layer forming an organic EL element included in the organic EL display device according to the first embodiment of the present invention.

As illustrated in FIG. 1, an organic EL display device 1 includes an element substrate 10, and organic EL elements 4 above the element substrate 10.

The element substrate 10 may be configured as, e.g., a glass substrate or plastic substrate.

The plastic substrate is a flexible film-like substrate made of an insulating resin material. The resin material forming the plastic substrate may be, for example, an organic material such as polyimide resin and acrylic resin.

As illustrated in FIG. 1, the organic EL display device 1 includes a display region 15 in which the organic EL elements 4 are placed. In this display region 15, the organic EL elements 4 are arranged in a matrix above the element substrate 10. This display region 15 is formed by arranging display device regions 15R emitting red light, display device regions 15G emitting green light, and display device regions 15B emitting blue light in a predetermined pattern.

As illustrated in FIG. 1, each organic EL element 4 includes, above the element substrate 10, a predetermined array (e.g., a matrix) of first electrodes (anodes) 13, organic EL layers 17 on the respective first electrodes 13, and second electrodes (cathodes) 14 on the respective organic EL layers 17.

The organic EL element 4 also includes edge covers 18 to cover the peripheral edges of the first electrodes 13 and regions without the first electrodes 13. Each edge cover 18 is interposed among the pixel regions 15R, 15G, and 15B, and functions as a partition segmenting the pixel regions 15R, 15G, and 15B.

Moreover, as illustrated in FIG. 1, the organic EL display device 1 includes thin film transistors (TFTs) 11 and interlayer insulating films 21. Each of TFTs 11 is formed above the element substrate 10, and electrically connected to a corresponding one of the first electrodes 13 arranged in the predetermined array. The interlayer insulating films 21 are formed above the element substrate 10 to cover the TFTs 11.

The first electrodes 13 function to inject holes (positive holes) into the organic EL layers 17. The first electrodes 13 beneficially contain a material with a high work function. This is because a material with a high work function allows the first electrodes 13 to inject holes to the organic EL layers 17 with higher efficiency. Furthermore, as illustrated in FIG. 1, the first electrodes 13 are formed above the interlayer insulating film 21.

Examples of the material of the first electrodes 13 include metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The first electrodes 13 may also be an alloy of, for example, magnesium (Mg)/copper (Cu), magnesium (Mg)/silver (Ag), sodium (Na)/potassium (K), astatine (At)/astatine dioxide (AtO$_2$), lithium (Li)/aluminum (Al), lithium (Li)/calcium (Ca)/aluminum (Al), or lithium fluoride (LiF)/calcium (Ca)/aluminum (Al). The first electrodes 13 may also be a conductive oxide such as tin oxide (SnO), zinc oxide (ZnO), indium tin oxide (ITO), and indium zinc oxide (IZO).

Moreover, the first electrodes 13 may be multilayers containing the above materials. Examples of materials with a high work function include indium tin oxide (ITO) and indium zinc oxide (IZO).

Formed above the element substrate 10, the interlayer insulating films 21 function to planarize surfaces of the TFTs 11. Due to this interlayer insulating film 21, the first electrodes 13 and the organic EL layers 17 are formed flat on or above the interlayer insulating film 21. That is, the planarization using the interlayer insulating film 21 reduces the risk that steps, protrusions, and recesses of the underlayers in the organic EL display device 1 influence the shape of the surface of the first electrodes 13, causing light emission by the organic EL layer 17 to be non-uniform. The interlayer insulating film 21 contains a highly transparent, low-cost organic resin material such as acrylic resin.

As illustrated in FIG. 1, the first electrodes 13 are electrically connected to the TFTs 11 via contact holes 23 formed in the interlayer insulating film 21.

Each organic EL layer 17 is formed on a surface of a corresponding one of the first electrodes 13 arranged in a matrix. As illustrated in FIG. 2, each organic EL layer 17 includes a hole injection layer 40, a hole transport layer 41, a light-emitting layer 42, an electron transport layer 43, and an electron injection layer 44. The hole transport layer 41 is formed on the surface of the hole injection layer 40. The light-emitting layer 42 is formed on the surface of the hole transport layer 41, and emits either red, green, or blue light. The electron transport layer 43 is formed on the surface of the light-emitting layer 42. The electron injection layer 44 is formed on the surface of the electron transport layer 43. Each organic EL layer 17 is formed by sequentially stacking the hole injection layer 40, the hole transport layer 41, the light-emitting layer 42, the electron transport layer 43, and the electron injection layer 44. The organic EL layer 17 may be smaller in area than the underlying first electrodes 13. Alternatively, the organic EL layer 17 may be larger in area than the underlying first electrodes 13 to cover the first electrodes 13.

The hole injection layer 40 is also called an anode buffer layer, which causes the energy levels of the first electrodes 13 and the organic EL layers 17 to approach each other to increase the efficiency of the first electrodes 13 injecting the holes to the organic EL layers 17.

Examples of the material of the hole injection layer 40 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 41 increases the efficiency in transporting holes from the first electrodes 13 to the organic EL layers 17. Examples of the material of the hole transport layer 41 include porphyrin derivatives, aromatic tertiary amine compounds, styryl amine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 42 is a region in which the holes and the electrons are injected thereinto from the first electrodes 13 and second electrode 14 and recombine with each other when a voltage is applied from the first electrodes 13 and the second electrode 14. This light-emitting layer 42 is made of a material with high luminous efficiency. Examples of the material include metal oxinoid compounds (8-hydroxyquinoline metal complexes), naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rodamine derivatives, acridine derivatives, phenoxazine, quinacridone derivatives, rubrene, poly-p-phenylene vinylene, and polysilane.

The electron transport layer 43 functions to efficiently move electrons to the light-emitting layer 42. Examples of the material of the electron transport layer 43 include, as organic compounds, oxadiazole derivatives, triazole derivatives, benzoquinone derivatives, naphthoquinone derivatives, anthraquinone derivatives, tetracyanoanthraquinodimethan derivatives, diphenoquinone derivatives, fluorenone derivatives, silole derivatives, and metal oxinoid compounds.

The electron injection layer 44 causes the energy levels of the second electrode 14 and the organic EL layers 17 to approach each other to increase the efficiency in injecting electrons from the second electrode 14 into the organic EL layers 17, thereby reducing the drive voltage of the organic EL element 4. The electron injection layer may also be called a cathode buffer layer. Examples of the material of the electron injection layer 44 include inorganic alkaline compounds such as lithium fluoride (LiF), magnesium fluoride ($MgF_2$), calcium fluoride ($CaF_2$), strontium fluoride ($SrF_2$), barium fluoride ($BaF_2$), $Al_2O_3$, and SrO.

The second electrode 14 functions to inject electrons into the organic EL layer 17. The second electrode 14 may beneficially contain a material with a low work function. This is because a material with a low work function allows the second electrode 14 to inject electrons into the organic EL layer 17 with higher efficiency. As illustrated in FIG. 1, the second electrode 14 is formed above the organic EL layer 17.

Examples of materials of the second electrode 14 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 14 may also be an alloy of, e.g., magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), and lithium fluoride (LiF)/calcium (Ca)/aluminum (Al). The second electrode 14 may also contain a conductive oxide such as tin oxide (SnO), zinc oxide (ZnO), or indium tin oxide (ITO) and indium zinc oxide (IZO). The second electrode 14 may be a multilayer containing the above materials.

A material with a low work function may be, for example, magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), or lithium fluoride (LiF)/calcium (Ca)/aluminum (Al).

The edge covers 18 function to reduce short-circuit between the first electrodes 13 and the second electrode 14. Thus, the edge covers 18 beneficially cover entire peripheral edges of the first electrodes 13.

Examples of the material of the edge covers 18 include an organic resin material such as acrylic resin like the interlayer insulating film 21, and inorganic materials such as silicon dioxide ($SiO_2$), silicon nitride ($SiN_x$, where x is a positive number) such as $Si_3N_4$, and silicon oxynitride (SiNO).

Examples of the material of first to third sealing layers 25 to 27 include silicon nitride ($SiN_x$, where x is a positive number) such as $Si_3N_4$.

As illustrated in FIG. 1, the organic EL display device 1 also includes a sealing film 2. This sealing film 2 protects the organic EL element 4 from oxygen and moisture. As illustrated in FIG. 1, the sealing film 2 is provided above the element substrate 10 to cover the organic EL elements 4.

Figure 3:
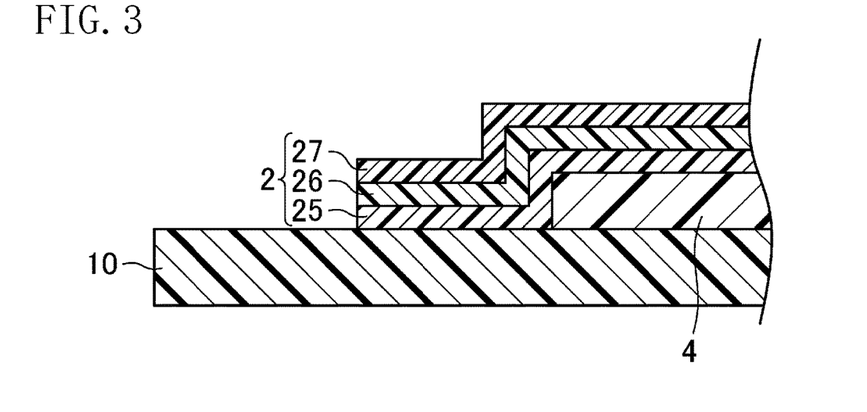
FIG. 3 is a cross-sectional view illustrating a configuration of a sealing film included in the organic EL display device according to the first embodiment of the present invention.

In this embodiment, as illustrated in FIG. 3, the sealing film 2 is a multilayer including the first sealing layer 25 provided on the surface of the organic EL element 4, the second sealing layer 26 provided on the surface of the first sealing layer 25, and a third sealing layer 27 provided on the surface of the second sealing layer 26.

In this embodiment, a ratio of an SiN-group content to an NH-group content is higher in the first and third sealing layers 25 and 27 than in the second sealing layer 26 based on an absorption area ratio determined by FT-IR measurement (Fourier transform infrared spectroscopic analysis).

In the first sealing layer 27 with the higher ratio of the SiN-group content to the NH-group content, SiN fine particles tend to be bonded to one another. Thus, the first sealing layer 27 becomes a dense layer with less grain boundary planes (i.e., less interfaces between the SiN fine particles). If the layer has pin holes, no film may grow on the pin holes, resulting in the pin holes being left in the first sealing layer 27.

However, in this embodiment, the second sealing layer 26 has the lower ratio of the SiN-group content to the NH-group content. Thus, this allows for providing the second sealing layer 26 on the surface of the first sealing layer 25 without depending on the pin holes existing in the first sealing layer 25. Therefore, this makes it possible to cover the pin holes existing in the first sealing layer 25. As a result, the sealing film 2 can block entry of moisture and oxygen from the outside regardless of the pin holes existing in the first sealing layer 25.

The second sealing layer 26 with the lower ratio of the SiN-group content to the NH-group content tends to have fine particles due to many terminals of the N—H bonds. Therefore, when the layer grows as an SiN$_x$ film, the SiN fine particles are less likely to be bonded to one another, and as a result, the layer may become a less dense layer with many grain boundary planes (i.e., interfaces between the fine particles).

In this embodiment, as described above, the third sealing layer 27 (i.e., a dense layer) with the higher ratio of the SiN-group content to the NH-group content is provided on the surface of the second sealing layer 26 to cover the grain boundary planes in the second sealing layer 26. This reduces the risk of exposing the grain boundary planes to improve the barrier properties.

That is to say, this embodiment has a configuration in which the first and third sealing layers 25 and 27 serving as the dense layers sandwich the second sealing layer 26 serving as the less dense layer therebetween (sandwich configuration). Such a configuration enables the sealing film 2 to reliably block entry of moisture and oxygen from the outside even if there exists a pin hole.

In order to improve barrier properties of the sealing film 2 having the configuration in which the first and third sealing layers 25 and 27 serving as the dense layers sandwich the second sealing layer 26 serving as the less dense layer therebetween, the ratio of the SiN-group content to the NH-group content in the first and third sealing layers 25 and 27 is preferably 24.6 or higher. The ratio of the SiN-group content to the NH-group content in the second sealing layer 26 is preferably 20.0 or lower.

In order to allow the organic EL element 4 to have sufficient durability, the sealing film 2 beneficially has a thickness within the range from 1 to 100 μm.

An exemplary method of manufacturing an organic EL display device according to this embodiment will now be described. FIGS. 4 to 7 are cross-sectional views illustrating a method of manufacturing an organic EL display device according to an embodiment of the present invention.

Figure 4:
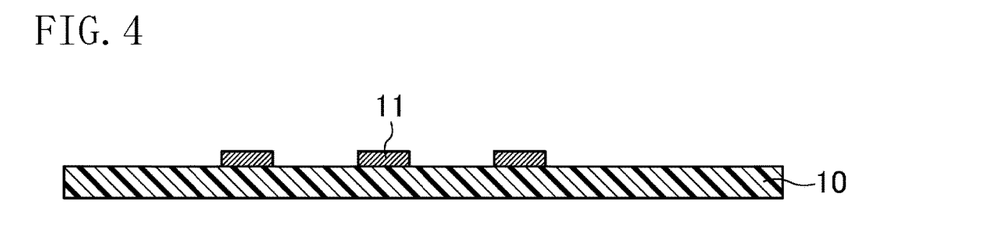
FIG. 4 is a cross-sectional view illustrating a method of manufacturing the organic EL display device according to the first embodiment of the present invention.

First, as illustrated in FIG. 4, the TFTs 11 for driving the organic EL element 4 are formed at predetermined intervals on the element substrate 10 in a size of 320×400 mm and with a thickness of 0.7 mm.

Figure 5:
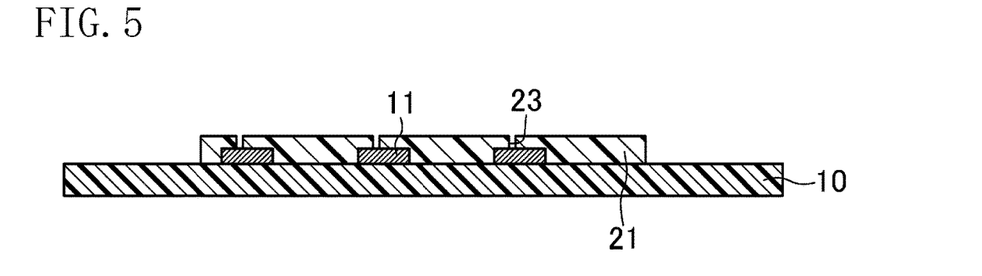
FIG. 5 is a cross-sectional view illustrating the method of manufacturing the organic EL display device according to the first embodiment of the present invention.

Next, as illustrated in FIG. 5, a photosensitive acrylic resin is applied onto the element substrate 10 including the TFTs 11 by spin coating, and is exposed to a predetermined amount (e.g., 200 mJ/cm$^2$) of light through an exposure mask with a predetermined exposure pattern. Then, development is performed using an alkaline developer. As a result, the interlayer insulating film 21 with a thickness of, for example, 2 μm is formed. After the development, the interlayer insulating film 21 is baked in post-baking under a predetermined condition (e.g., at a temperature of 220° C. for 60 minutes).

At this time, the contact holes 23 (with a diameter of, for example, 5 μm) for electrically connecting the first electrodes 13 to the TFTs 11 are formed in the interlayer insulating film 21.

Figure 6:
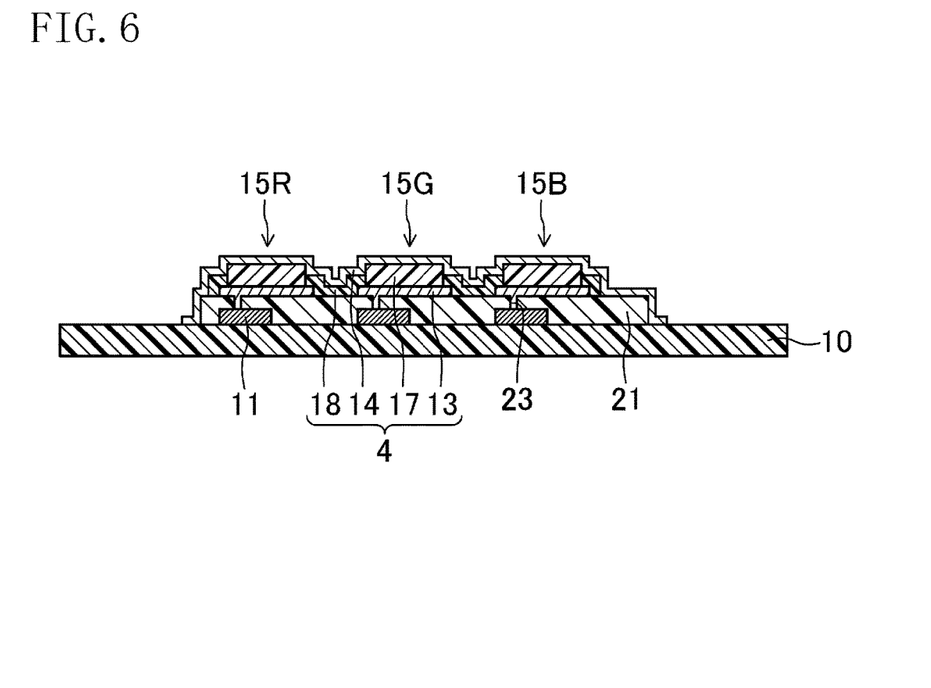
FIG. 6 is a cross-sectional view illustrating the method of manufacturing the organic EL display device according to the first embodiment of the present invention.

Next, as illustrated in FIG. 6, an indium tin oxide (ITO) film is formed by sputtering, exposed to light by photolithography and developed, and patterned by etching to form the first electrodes 13 on the interlayer insulating film 21. At this time, the first electrodes 13 are formed to have a thickness of approximately 100 nm, for example. After the development, the first electrodes 13 are baked in post-baking under a predetermined condition (e.g., at a temperature of 220° C. for 120 minutes). The first electrodes 13 are electrically connected to the TFTs 11 via the contact holes 23 formed in the interlayer insulating film 21.

Next, as illustrated in FIG. 6, a photosensitive acrylic resin is applied onto the element substrate 10 including the first electrodes 13 by spin coating, and is exposed to a predetermined amount (e.g., 150 mJ/cm$^2$) of light through an exposure mask with a predetermined exposure pattern. Then, development is performed using an alkaline developer. As a result, the edge covers 18 are formed so as to cover the entire peripheral edges of the first electrodes 13. At this time, the edge covers 18 are formed to have a thickness of about 1.5 μm, for example.

Then, the organic EL layers 17 including the light-emitting layer 42 are formed on the first electrodes 13, and after that, the second electrodes 14 are formed on the organic EL layers 17. The organic EL layers 17 and the second electrodes 14 are formed by vapor deposition using a metal mask.

More specifically, first, the element substrate 10 having the first electrodes 13 as illustrated in FIG. 6 is placed in a chamber of a vapor deposition system. The inside of the chamber of the vapor deposition system is kept at a vacuum degree of $1\times10^{-5}$ to $1\times10^{-4}$ Pa by a vacuum pump. Moreover, the element substrate 10 having the first electrodes 13 is placed while two sides of the element substrate 10 are secured with a pair of substrate holders provided to the interior of the chamber.

In an evaporation source, source materials (evaporants) of the hole injection layer 40, the hole transport layer 41, the light-emitting layer 42, the electron transport layer 43, and the electron injection layer 44 evaporate sequentially. Then, these layers are stacked to form the organic EL layers 17 in pixel regions as illustrated in FIG. 6.

Next, as illustrated in FIG. 6, the second electrodes 14 are formed on the organic EL layers 17. As a result, the organic EL elements 4 including the first electrodes 13, the organic EL layers 17, the second electrodes 14, and the edge covers 18 are formed on or above the element substrate 10.

Note, for example, that a crucible containing the evaporants is used as the evaporation source. The crucible is placed at a lower position inside the chamber, and includes a heater, which heats the crucible.

The heat of the heater allows the temperature inside the crucible to reach the evaporation temperatures of the evaporants so that the evaporants inside the crucible turn to vapor, and the vapor jumps out upward inside the chamber.

A specific example method of forming the organic EL layers 17 and the second electrodes 14 is as follows. First, on the first electrodes 13, which are patterned on the element substrate 10, the hole injection layer 40 made of m-MTDATA(4,4,4-tris(3-methylphenylphenylamino)triphenylamine) is formed with a thickness of, for example, 25 nm in common among all of RGB pixels, via a mask.

Then, on the hole injection layer 40, the hole transport layer 41 made of α-NPD(4,4-bis(N-1-naphthyl-N-phenylamino)biphenyl) is formed with a thickness of, for example, 30 nm in common among all RGB pixels via a mask.

Next, the light-emitting layer 42 of the red color is formed with a thickness of, for example, 30 nm on the hole transport layer 41 in the associated pixel regions via a mask. The light-emitting layer 42 of the red color is made of a mixture of 2,6-bis((4'-methoxydiphenylamino)styryl)-1,5-dicyanonaphthalene (BSN) with di(2-naphthyl)anthracene (ADN), the concentration of BSN being 30 wt %.

After that, the light-emitting layer 42 of the green color is formed with a thickness of, for example, 30 nm on the hole transport layer 41 in the associated pixel regions via a mask. The light-emitting layer 42 of the green color is made of a mixture of coumarin 6 with ADN, the concentration of coumarin 6 being 5 wt %.

Then, the light-emitting layer 42 of the blue color is formed with a thickness of, for example, 30 nm on the hole transport layer 41 in the associated pixel regions via a mask. The light-emitting layer 42 of the blue color is made of a mixture of 4,4'-bis(2-{4-(N,N-diphenylamino)phenyl}vinyl)biphenyl (DPAVBi) with ADN, the concentration of DPAVBi being 2.5 wt %.

Next, 8-hydroxyquinoline aluminum ($Alq_3$) is formed, as the electron transport layer 43, with a thickness of for example, 20 nm in common among all the RGB pixels on the light-emitting layer 42 of all the colors via a mask.

After that, lithium fluoride (LiF) is formed, as the electron injection layer 44, with a thickness of, for example, 0.3 nm on the electron transport layer 43 via a mask.

Then, the second electrodes 14 made of aluminum (Al) are formed with a thickness of, for example, 100 nm by vacuum vapor deposition.

Figure 7:
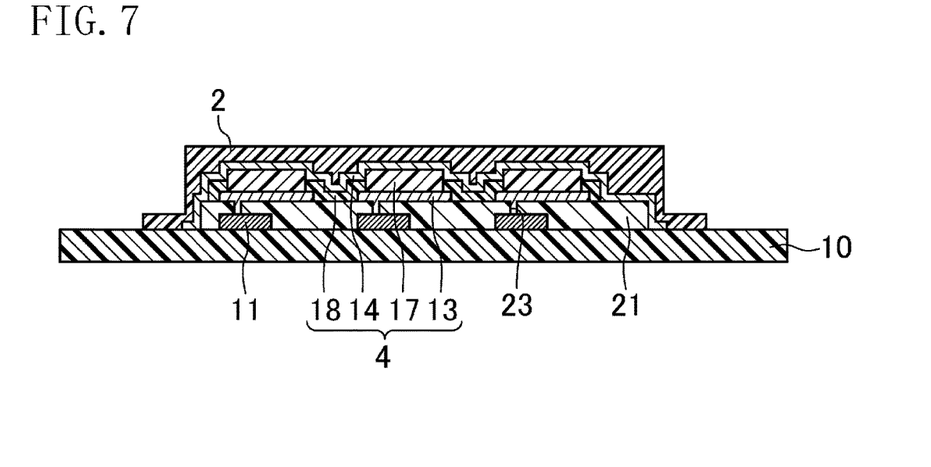
FIG. 7 is a cross-sectional view illustrating the method of manufacturing the organic EL display device according to the first embodiment of the present invention.

After that, as illustrated in FIG. 7, the sealing film 2 is formed on the element substrate 10 to cover the organic EL element 4.

Here, in this embodiment, the first to third sealing layers 25 to 27 constituting the sealing film 2 is formed by the plasma CVD method. This embodiment is characterized in that the method of forming the first and third sealing layers 25 and 27 serving as the dense layers is different from the method of forming the second sealing layer 26 serving as the less dense layer.

That is to say, the first sealing layer 25 is formed by forming a silicon nitride film on the surface of the organic EL element 4. The second sealing layer 26 is formed by depositing silicon nitride, that has been formed in a plasma region above the first sealing layer 25, on the surface of the first sealing layer 25. The third sealing layer 27 is formed by forming a silicon nitride film on the surface of the second sealing layer 26. The specific formation manner will be described in detail.

First, the first sealing layer 25 is formed on the surface of the element substrate 10. More specifically, first, a target substrate (a substrate including the organic EL element 4 illustrated in FIG. 6) is provided in a processing chamber of a plasma processing device, and gas in the interior of the processing chamber is exhausted to set the interior of the processing chamber in a predetermined vacuum state.

Next, a material gas is introduced into the processing chamber in which the target substrate is disposed. Examples of the material gas for use include $SiH_4$, $H_2$, and $N_2$. More specifically, for example, silane gas ($SiH_4$), ammonia gas ($NH_3$), hydrogen ($H_2$), and nitrogen ($N_2$) are used as the material gas for forming a silicon nitride film.

At that time, for example, a silane gas flow rate, an ammonia gas flow rate, a hydrogen gas flow rate, and a nitrogen gas flow rate can be set to 100 sccm, 300 sccm, 1000 sccm, and 1000 sccm, respectively. Also, the material gas is introduced under a pressure of 200 Pa, for example. Note that "sccm" refers to a quantity of gas flowing in cubic centimeter per minute at 0° C. The first sealing layer 25 is formed at, e.g., 200 nm/minute in the thickness direction.

Subsequently, plasma is generated to subject the surface of the target substrate to plasma processing. More specifically, for example, a pulse voltage is applied between anode and cathode electrodes in the plasma processing device to generate plasma. This plasma is generated according to a voltage (potential difference) applied between the anode and cathode electrodes. Examples of power supplies for applying a voltage include a microwave power supply (frequency: 2.45 GHz) and a high frequency power supply (frequency: 13.56 MHz).

The output of the power supply is, e.g., 500-2000 W, but can be adjusted as appropriate depending on the power supply frequency and the size of the electrode. Furthermore, a distance between the electrodes can be set to, e.g., 2-4 cm.

As a result, a film grows on the surface of the organic EL layer 4 to form the first sealing layer 25. More specifically, first, the silane gas decomposed reaches the surface of the organic EL element 4, and consecutively reacts to the ammonia gas decomposed to form SiN. Then, the SiN grows while continuously linking with the SiN film that has already been formed on the surface of the organic EL element 4, and the N—H bonds are decomposed during the process. In other words, in the stage of forming the first sealing layer 25, the reaction on the surface of the organic EL element 4 occurs superiorly, and thus, there is a two-dimensional reaction surface. In the reaction process, the reaction proceeds while the N—H bonds are efficiently decomposed. As a result, the N—H bond amount is decreased to increase a ratio of an SiN peak area to an NH peak area, resulting in the formation of the dense, first sealing layer 25 with the higher ratio of the SiN-group content to the NH-group content.

If the process is done at a too much high temperature during the film formation, the organic EL element 4 is damaged to deteriorate light-emitting efficiency and light-emitting life. Therefore, the temperature at the formation of the first sealing layer 25 is preferably 100° C. or less. For example, the temperature in the processing chamber and the temperature of the electrodes are adjusted to adjust the temperature during the process.

Next, the second sealing layer 26 serving as the less dense layer is formed on the surface of the first sealing layer 25. More specifically, the second sealing layer 26 is formed on the surface of the first sealing layer 25 by forming silicon nitride in a plasma space between the anode and cathode electrodes, and depositing the silicon nitride, that has been formed in the plasma space, on the surface of the first sealing layer 25.

For example, adjusting the distance between the anode and cathode electrodes (electrode distance), the output of the power supply, and the gas flow rate can facilitate formation of the silicon nitride in the plasma space between the anode and cathode electrodes.

More specifically, for example, prolonging the distance between the anode and cathode electrodes, and prolonging the distance between the plasma generated and the target substrate causes a decrease in the chemical reaction near the surface of the target substrate to allow for facilitating the chemical reaction in the plasma space.

Increasing the output of the power supply causes an increase in the plasma energy, thereby allowing for facilitating the chemical reaction in the plasma space. Furthermore, increasing the hydrogen gas flow rate increases hydrogen plasma, and thus, the silane gas ($SiH_4$) and ammonia gas ($NH_3$) are quickly decomposed to facilitate the reaction between these gases prior to these gases reaching the wall surface of the target substrate (i.e., the reaction in the plasma space occurs superiorly).

For example, in the formation of the first sealing layer 25, the hydrogen gas flow rate, the output of the power supply, and the distance between the electrodes are set to 1000 sccm, 800 W, and 2.3 cm, respectively. In contrast, in the formation of the second sealing layer 26, the hydrogen gas flow rate, the output of the power supply, and the distance between the electrodes are set to 1500 sccm, 1200 W, and 3.2 cm, respectively.

Also, as well as in the formation of the first sealing layer 25, the material gas is introduced under a pressure of 200 Pa, for example. The second sealing layer 26 is formed at, e.g., 300 nm/minute in the thickness direction.

In this way, compared with the case of forming the first sealing layer 25 serving as the dense layer, in the formation of the second sealing layer 26 serving as the less dense layer, the output of the power supply is increased to increase the formation speed, thereby allowing the silane gas having a three-dimensional reaction surface in the plasma to react to the ammonia gas in all the directions at the same time. Thus, the reaction speed is increased, and the N—H bonds tend to be easily introduced into the fine particles. As a result, the N—H bond amount is increased to decrease the ratio of the SiN peak area to the NH peak area, resulting in the formation of the less dense, second sealing layer 26 with the lower ratio of the SiN-group content to the NH-group content.

Therefore, as described above, the second sealing layer 26 can cover the pin holes existing in the first sealing layer 25. As a result, the sealing film 2 can block entry of moisture and oxygen from the outside even if the pin hole exists in the first sealing layer 25.

Next, by a method similar to the method of forming the first sealing layer 25, a film is allowed to grow on the surface of the second sealing layer 26 to form the third sealing layer 27 serving as the dense layer on the surface of the second sealing layer 26.

More specifically, first, the silane gas decomposed reaches the surface of the second sealing layer 26, and consecutively reacts to the ammonia gas decomposed to form SiN. Then, the SiN grows while continuously linking with the SiN film that has already been formed on the surface of the second sealing layer 26, and the N—H bonds are decomposed during the process. As a result, the N—H bond amount is decreased to increase the ratio of the SiN peak area to the NH peak area, resulting in the formation of the dense, third sealing layer 27 with the higher ratio of the SiN-group content to the NH-group content on the surface of the second sealing layer 26.

As a result, as described above, the third sealing layer 27 covers the grain boundary planes in the second sealing layer 26. This reduces the risk of exposing the grain boundary planes to improve the barrier properties of the sealing film 2.

In the foregoing manner, the organic EL display device 1 of this embodiment which includes the sealing film 2 comprised of the first to third sealing layers 25 to 27 may be manufactured.

This embodiment described above provides the following advantages.

(1) In this embodiment, the sealing film 2 is comprised of the first sealing layer 25 provided on the surface of the organic EL element 4, the second sealing layer 26 provided on the surface of the first sealing layer 25, and the third sealing layer 27 provided on the surface of the second sealing layer 26. The ratio of the SiN-group content to the NH-group content is set to be higher in the first and third sealing layers 25 and 27 than in the second sealing layer 26 based on the absorption area ratio determined by FT-IR measurement. Therefore, the sealing film 2 can block entry of moisture and oxygen from the outside even if a pin hole exists in the first sealing layer 25. Thus, the sealing film 2 has improved barrier properties against moisture and oxygen to be able to reduce the deterioration of the organic EL element 4.

(2) In this embodiment, the ratio of the SiN-group content to the NH-group content in the first and third sealing layers 25 and 27 is set to be 24.6 or higher, and the ratio of the SiN-group content to the NH-group content in the second sealing layer 26 is set to be 20.0 or lower. Accordingly, this can reliably improve the barrier properties of the sealing film 2 in the configuration in which the first and third sealing layers 25 and 27 serving as the dense layers sandwich the second sealing layer 26 serving as the less dense layer therebetween.

(3) In this embodiment, the first to third sealing layers 25 to 27 are formed by the plasma CVD method. The first sealing layer 25 is formed by forming a silicon nitride film on the surface of the organic EL element 4. The second sealing layer 26 is formed by depositing a silicon nitride film, that has been formed in the plasma region above the first sealing layer 25, on the surface of the first sealing layer 25. The third sealing layer 27 is formed by forming a silicon nitride film on the surface of the second sealing layer 26. Accordingly, it is possible to form the first to third sealing layers 25 to 27 by changing the processing conditions in the same plasma processing system. As a result, the sealing film 2 can easily be formed at a lower cost.

Second Embodiment

Figure 8:
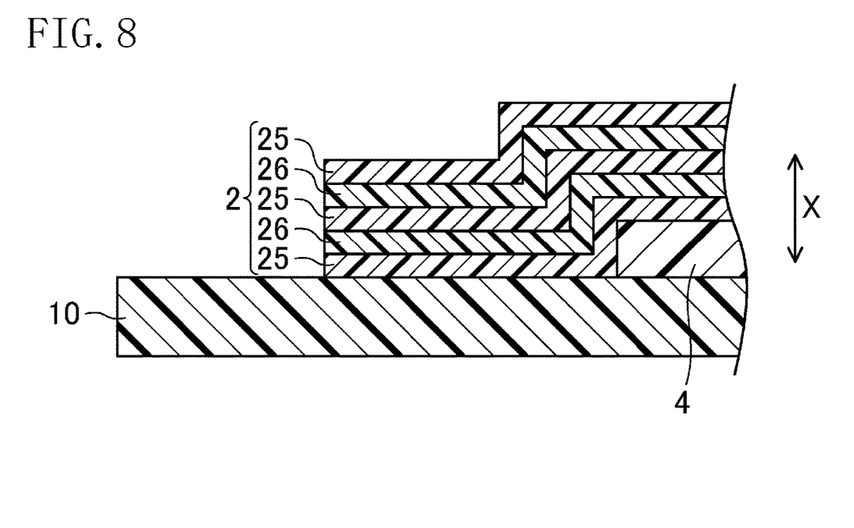
FIG. 8 is a cross-sectional view illustrating a configuration of a sealing film included in an organic EL display device according to a second embodiment of the present invention.

A second embodiment of the present invention will now be described. FIG. 8 is a cross-sectional view illustrating a configuration of a sealing film according to the second embodiment of the present invention. The entire configuration of the organic EL display device is the same as in the above first embodiment, and the detailed explanation thereof will be omitted. The same reference numerals as those in the first embodiment are used to represent equivalent elements, and the detailed explanation thereof will be omitted.

As illustrated in FIG. 8, the organic EL display device of this embodiment is characterized in that the sealing film 2 is formed by alternately stacking the first and second sealing layers 25 and 26 (in FIG. 8, three first sealing layers 25 and two second sealing layers 26 are alternately stacked), and the first sealing layer 25 serving as the dense layer is provided on the surface of the organic EL element 4.

The embodiment described above provides the following advantages in addition to the advantages (1) to (3) described above.

(4) The sealing film 2 has a configuration in which the first sealing layer 25 serving as the dense layer and the second sealing layer 26 serving as the less dense layer are alternately stacked. Thus, in the sealing film 2, the number of the pin holes passing through in a thickness direction (the direction indicated by the arrow X in FIG. 8) is decreased. As a result, it becomes possible to further improve the barrier properties of the sealing film 2 against moisture and oxygen.

(5) Even if a foreign particle exists on the organic EL element 4, the sealing film 2 stacked can sufficiently cover such a foreign particle. This can effectively reduce generation of a dark spot due to the foreign particle.

Third Embodiment

Figure 9:
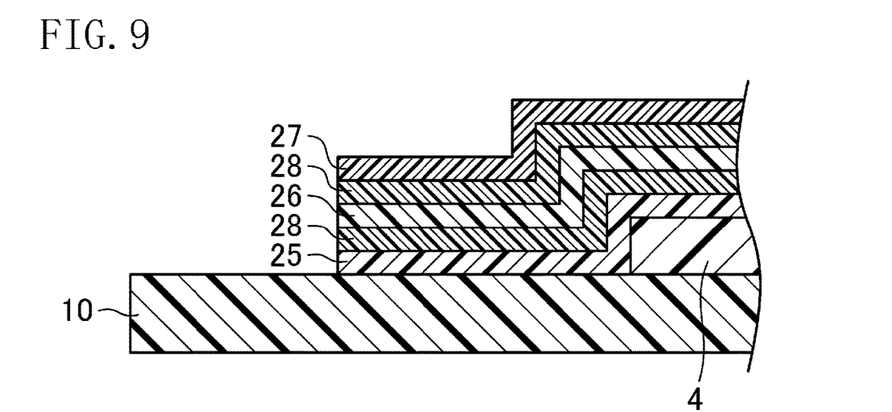
FIG. 9 is a cross-sectional view illustrating a configuration of a sealing film included in an organic EL display device according to a third embodiment of the present invention.

A third embodiment of the present invention will now be described. FIG. 9 is a cross-sectional view illustrating a configuration of a sealing film according to the third embodiment of the present invention. The same reference numerals as those in the first embodiment are used to represent equivalent elements, and the detailed explanation thereof will be omitted.

As illustrated in FIG. 9, the organic EL display device of this embodiment includes the sealing film 2 including a fourth sealing layer 28 comprised of silicon nitride, wherein the fourth sealing layer 28 is provided between the first and second sealing layers 25 and 26, and is also provided between the second and third sealing layers 26 and 27.

The organic EL display device is characterized in that the ratio of the SiN-group content to the NH-group content in the fourth sealing layer 28 is set to be lower than that in the first and third sealing layers 25 and 27, and higher than that in the second sealing layer 26 based on the absorption area ratio determined by FT-IR measurement.

As well as the above first and third sealing layers 25 and 27, the fourth sealing layer 28 is formed by forming a silicon nitride film on the surface of the first and second sealing layers 25 and 26.

The embodiment described above provides the following advantages in addition to the advantages (1) to (3) described above.

(6) The sealing film 2 includes the fourth sealing layer 28 between the first and second sealing layers 25 and 26, the ratio of the SiN-group content to the NH-group content in the fourth sealing layer 28 being set to be lower than that in the first sealing layer 25, and higher than that in the second sealing layer 26. Thus, compared with the case where only the first and second sealing layers 25 and 26 are provided, "the ratio of the SiN-group content to the NH-group content" on each interface of the sealing layers varies mildly (i.e., a change in composition of silicon nitride becomes mild). As a result, this makes it possible to reduce a decrease in adhesion between the sealing layers constituting the sealing film 2.

Likewise, the sealing film 2 also includes the fourth sealing layer 28 between the second and third sealing layers 26 and 27, the ratio of the SiN-group content to the NH-group content in the fourth sealing layer 28 being set to be lower than that in the third sealing layer 27, and higher than that in the second sealing layer 26. Thus, compared with the case where only the second and third sealing layers 26 and 27 are provided, "the ratio of the SiN-group content to the NH-group content" on each interface of the sealing layers varies mildly (i.e., a change in composition of silicon nitride becomes mild). As a result, this makes it possible to reduce a decrease in adhesion between the sealing layers constituting the sealing film 2.

The embodiments may be modified as follows.

In the second embodiment, three first sealing layers 25 and two second sealing layers 26 are alternately stacked to form the sealing film 2. The number of the first sealing layers 25 and the number of the second sealing layers 26 are not particularly limited. Alternatively, for example, five first sealing layers 25 and four second sealing layers 26 may be alternately stacked to allow the sealing film 2 to have a nine-layer configuration.

Also, in the third embodiment, the fourth sealing layer 28 is provided not only in a space between the first and second sealing layers 25 and 26, but also in a space between the second and third sealing layers 26 and 27. Alternatively, the fourth sealing layer 28 may be provided in at least one of the space between the first and second sealing layers 25 and 26 and the space between the second and third sealing layers 26 and 27.

The above embodiments may also have a configuration where a sealing substrate, a sealer, and a filler are provided. The sealing substrate is provided so as to face the element substrate 10. The sealer is provided between the element substrate 10 and the sealing substrate, and seals the element substrate 10 and the sealing substrate so as to seal the organic EL element 4. The filler is provided on the sealing film 2 so as to cover the sealing film 2.

Figure 10:
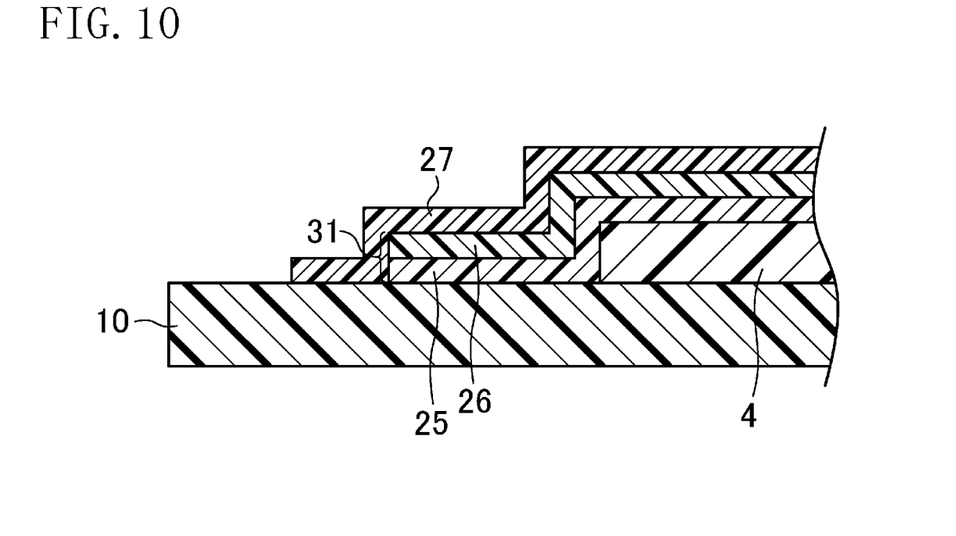
FIG. 10 is a cross-sectional view illustrating a configuration of a sealing film included in an organic EL display device according to a variation of the present invention.

The first embodiment may also have a configuration where the third sealing layer 27 covers end faces 31 of the first and second sealing layers 25 and 26, as illustrated in FIG. 10. Such a configuration allows the sealing film 2 to have greater barrier properties against moisture to further reliably reduce the deterioration of the organic EL element 4.

In this case, the third sealing layer 27 can be formed by forming the first and second sealing layers 25 and 26 by the above described plasma CVD method using the same mask, and then, moving the mask to a space opposite to the element substrate 10 (that is to say, providing a space between the mask and the element substrate 10 and introducing gas more widely than an opening region of the mask).

Figure 11:
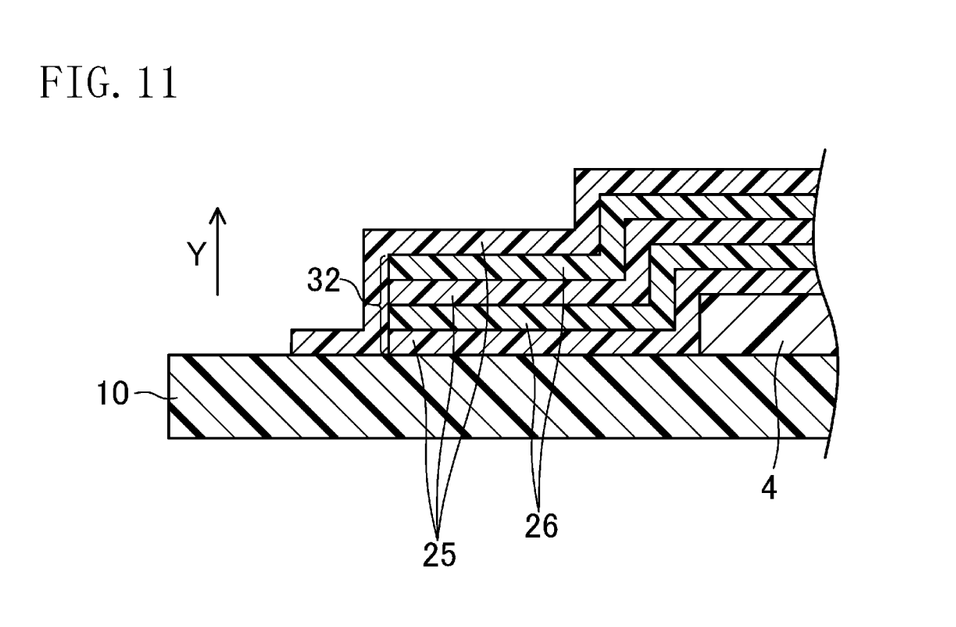
FIG. 11 is a cross-sectional view illustrating a configuration of a sealing film included in an organic EL display device according to another variation of the present invention.

As illustrated in FIG. 11, the second embodiment in which the first and second sealing layers 25 and 26 are alternately stacked may also have a configuration where the outermost layer (i.e., the first sealing layer 25 located furthest from the element substrate 10 in the thickness direction (the direction indicated by the arrow Y) in FIG. 11) covers end faces 32 of other sealing layers. Such a configuration allows the sealing film 2 to have greater barrier properties against moisture to further reliably reduce the deterioration of the organic EL element 4.

Figure 12:
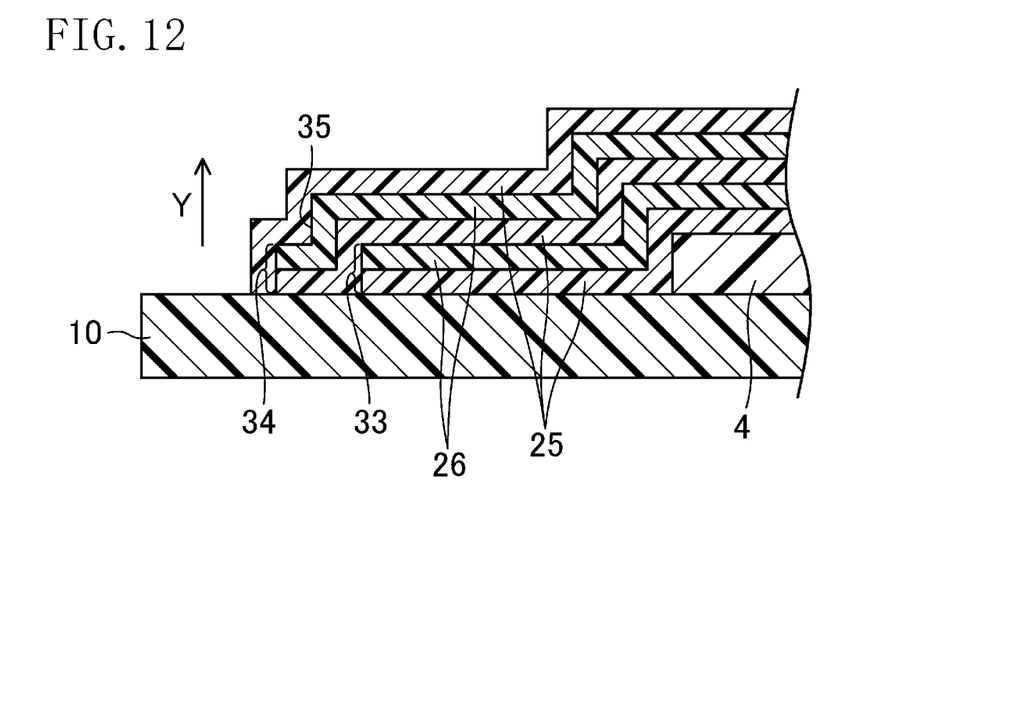
FIG. 12 is a cross-sectional view illustrating a configuration of a sealing film included in an organic EL display device according to yet another variation of the present invention.

As illustrated in FIG. 12, the second embodiment may also have a configuration where, of the first and second sealing layers 25 and 26 constituting the sealing film 2, an intermediate layer (i.e., the first sealing layer 25 that is a third layer counted from the element substrate 10 in the thickness direction (the direction indicated by the arrow Y) in FIG. 12) covers end faces 33 of the first and second sealing layers 25 and 26 which are formed under the intermediate layer, and the first sealing layer (the outermost layer) 25 covers an end face 34 of the first sealing layer 25 which is the intermediate layer, and an end face 34 of the second sealing layer 26 formed on the surface of the intermediate layer.

In this case, the outermost layer (the first sealing layer 25) can be formed by forming the first and second sealing layers 25 and 26 by the above described plasma CVD method using the same mask, then, forming the intermediate layer and the second sealing layer 26 on the surface of the intermediate layer by moving the mask to a space opposite to the element substrate 10, and further moving the mask to a space opposite to the element substrate 10.

Figure 13:
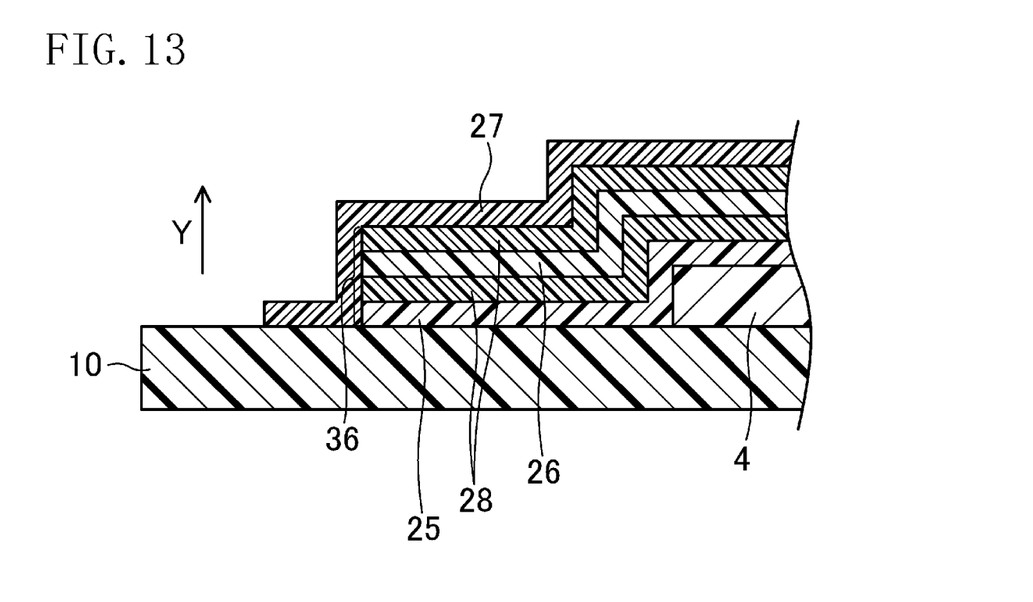
FIG. 13 is a cross-sectional view illustrating a configuration of a sealing film included in an organic EL display device according to still yet another variation of the present invention.

As illustrated in FIG. 13, the third embodiment in which the fourth sealing layer 28 is formed may also have a configuration where the outermost layer (i.e., the third sealing layer 27 located furthest from the element substrate 10 in the thickness direction (the direction indicated by the arrow Y) in FIG. 13) covers end faces 36 of other sealing layers. Such a configuration allows the sealing film 2 to have greater barrier properties against moisture to further reliably reduce the deterioration of the organic EL element 4.

In the embodiments described above, each of the organic EL layers 17 has a multilayer structure of five layers, namely, the hole injection layer 40, the hole transport layer 41, the light-emitting layer 42, the electron transport layer 43, and the electron injection layer 44. The multilayer structure is not limited to this five layers. For example, the multilayer structure may include three layers of a hole injection and transport layer, a light-emitting layer, and an electron injection and transport layer.

The multilayer structure may be inverted so that the first electrodes 13 function as cathodes, and the second electrodes 14 function as anodes. In this case, the multilayer structure may include, from the bottom, the first electrodes 13 as cathodes, the electron injection layer 44, the electron transport layer 43, the light-emitting layer 42, the hole transport layer 41, the hole injection layer 40, and the second electrodes 14 as anodes. In this case, the material of the first electrodes 13 and the material of the second electrodes 14 are replaced with each other.

EXAMPLES

The present invention will now be described based on examples. The present invention is not limited to these examples, and various modifications and variations of these examples can be made without departing from the scope and sprit of the present invention.

Example 1

Production of Sample

First, a calcium layer pattern with a thickness of 70 nm was formed on a glass substrate in a size of 320×400 mm and with a thickness of 0.7 mm by an evaporation method using an evaporation mask having a predetermined opening.

Next, the sealing film with a three-layer structure (i.e., the sealing film having a multilayer structure of the first to third sealing layers comprised of silicon nitride, and illustrated in FIG. 3) was formed on the glass substrate by the plasma CVD method described in the above first embodiment so as to cover the calcium layer to produce a sample in the examples.

The first, second, and third sealing layers had thicknesses of 0.1 μm, 0.3 μm, and 0.1 μm, respectively. The entire sealing film had a thickness of 0.5 μm.

FT-IR Measurement

Based on the absorption area ratio determined by FT-IR measurement, the ratio of the SiN-group content to the NH-group content in the first and third sealing layers (i.e., the dense layers) was 24.6, and the ratio of the SiN-group content to the NH-group content in the second sealing layer (i.e., the less dense layer) was 20.0.

The ratio of the SiN-group content to the NH-group content was measured using an FT-IR device (product name: Avatar370•Continupm manufactured by Thermo Fisher Scientific K.K.) within a range of 650-4000 $cm^{-1}$. An area ranging from approximately 3000 to 3500 $cm^{-1}$ was assumed to be the peak area of the N—H bonds, and an area ranging from approximately 600 to 1000 $cm^{-1}$ was assumed to be the peak area of the Si—N bonds. The ratio of the peak area of the Si—N bonds to the peak area of the N—H bonds was assumed to be the ratio of the SiN-group content to the NH-group content.

Comparative Example 1

A sample was made in a similar manner as described in Example 1 except that, instead of the sealing film having a three-layer structure, a sealing film comprised of a single sealing layer made of silicon nitride (the dense layer) was formed so as to cover the calcium layer. The sealing film has a thickness of 0.5 μm.

In a similar manner as in Example 1, the FT-IR measurement was performed. As a result, the ratio of the SiN-group content to the NH-group content was 24.6.

Comparative Example 2

A sample was made in a similar manner as described in Example 1 except that, instead of the sealing film having a three-layer structure, a sealing film comprised of a single sealing layer made of silicon nitride (the less dense layer) was formed so as to cover the calcium layer. The sealing film has a thickness of 0.5 μm.

In a similar manner as in Example 1, the FT-IR measurement was performed. As a result, the ratio of the SiN-group content to the NH-group content in the sealing layer was 20.0.

Evaluation of Barrier Properties

Next, the respective samples of Example 1 and Comparative Examples 1 and 2 were left under a high-temperature and high-humidity environment (temperature: 60° C., humidity: 95%) for 200 hours to evaluate the barrier properties of the sealing film.

More specifically, calcium is generally transparentized due to moisture and oxygen. Thus, after being left for 200 hours, a calcium retention rate that is a retention rate of calcium is not transparentized due to moisture and oxygen that has passed through the sealing film (i.e., an area of calcium layer not transparentized/an area of the entire formed calcium layer) was measured (calculated by image processing) to evaluate the barrier properties of the sealing film.

The barrier properties were evaluated twice with respect to the respective samples of Example 1 and Comparative Examples 1 and 2 to calculate the average value of the calcium retention rates measured. Table 1 shows the results.

TABLE 1

| | CALCIUM RETENTION RATE (%) |
|---|---|
| EXAMPLE | 90 |
| COMPARATIVE EXAMPLE 1 | 40 |
| COMPARATIVE EXAMPLE 2 | 2.5 |

As shown in Table 1, the calcium retention rate in Example 1 having the sealing film with the three-layer structure (i.e., the structure where the first and third sealing layers serving as the dense layers sandwich the second sealing layer serving as the less dense layer therebetween) is significantly higher than that in Comparative Examples 1 and 2 having the sealing film with the single layer (i.e., only the dense layer or the less dense layer). This shows that the sealing film of Example 1 can block entry of moisture and oxygen from the outside.

INDUSTRIAL APPLICABILITY

As can be seen from the foregoing description, the present invention is suitable for an organic EL display device including an organic EL element and a method of manufacturing such an organic EL display device.

DESCRIPTION OF REFERENCE CHARACTERS

1 Organic EL Display Device
2 Sealing Film
4 Organic EL Element
10 Element Substrate
17 Organic EL Layer
25 First Sealing Layer
26 Second Sealing Layer
27 Third Sealing Layer
28 Fourth Sealing Layer

The invention claimed is:

1. An organic EL display device, comprising:
   an element substrate;
   an organic EL element provided above the element substrate; and
   a sealing film provided above the element substrate so as to cover the organic EL element, the sealing film being made of silicon nitride (SiN$_x$), wherein
   the sealing film includes a first sealing layer provided on a surface of the organic EL element, a second sealing layer provided on a surface of the first sealing layer, and a third sealing layer provided on a surface of the second sealing layer,
   a ratio of a SiN-group content to a NH-group content is higher in the first sealing layer and the third sealing layer than in the second sealing layer based on an absorption area ratio determined by FT-IR measurement,
   a fourth sealing layer is provided between the first sealing layer and the second sealing layer,
   another fourth sealing layer is provided between the second sealing layer and the third sealing layer, and is made of a same material as the fourth sealing layer,
   end faces of the first sealing layer, the second sealing layer, the fourth sealing layer, and the another fourth sealing layer are flush with one another, and the third sealing layer is provided so as to cover the end faces of the first sealing layer, the second sealing layer, the fourth sealing layer, and the another fourth sealing layer, and
   a ratio of a SiN-group content to a NH-group content is lower in the fourth sealing layer than in the first sealing layer and the third sealing layer, and is higher in the fourth sealing layer than in the second sealing layer based on the absorption area ratio determined by FT-IR measurement.

2. The organic EL display device of claim 1, wherein the ratio of the SiN-group content to the NH-group content in the first sealing layer and the third sealing layers is 24.6 or higher, and the ratio of the SiN-group content to the NH-group content in the second sealing layer is 20.0 or lower.

3. The organic EL display device of claim 1, wherein the first sealing layer, the second sealing layer, and the third sealing layer are formed by a plasma CVD method.

4. The organic EL display device of claim 1, wherein the first sealing layer is in contact with the element substrate outside the organic EL element.

5. The organic EL display device of claim 4, wherein the third sealing layer is in contact with the element substrate outside the end faces of the first, second, and fourth sealing layers.

6. A method of manufacturing the organic EL display device of claim 1, the method comprising
   forming the sealing film such that the ratio of the SiN-group content to the NH-group content is higher in the first sealing layer and the third sealing layer than in the second sealing layer based on the absorption area ratio determined by FT-IR measurement, and
   after forming the first sealing layer and the second sealing layer by a CVD method using the same mask, providing a space between the mask and the element substrate by moving the mask to a position opposite to the element substrate, and forming the third sealing layer by the CVD method using the mask.

7. The method of claim 6, wherein the ratio of the SiN-group content to the NH-group content in the first sealing layer and the third sealing layer is 24.6 or higher, and the ratio of the SiN-group content to the NH-group content in the second sealing layer is 20.0 or lower.

8. The method of claim 6, wherein
   the first sealing layer, the second sealing layer, and the third sealing layer are formed by a plasma CVD method, and
   an output of a power supply is larger in forming the second sealing layer than in forming the first sealing layer.

9. The method of claim 6, wherein the third sealing layer covers end faces of the first sealing layer and the second sealing layer.

* * * * *